(12) United States Patent
Li et al.

(10) Patent No.: US 9,417,531 B2
(45) Date of Patent: Aug. 16, 2016

(54) METHOD FOR MAKING NANO-PILLAR ARRAY ON SUBSTRATE

(71) Applicants: Tsinghua University, Beijing (CN); HON HAI PRECISION INDUSTRY CO., LTD., New Taipei (TW)

(72) Inventors: Qun-Qing Li, Beijing (CN); Yuan-Hao Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/832,494

(22) Filed: Aug. 21, 2015

(65) Prior Publication Data
US 2016/0139511 A1    May 19, 2016

(30) Foreign Application Priority Data
Nov. 19, 2014    (CN) .......................... 2014 1 0660932

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *G03F 7/36* | (2006.01) |
| *H01J 37/32* | (2006.01) |
| *G03F 7/32* | (2006.01) |
| *G03F 7/20* | (2006.01) |

(52) U.S. Cl.
CPC .. *G03F 7/36* (2013.01); *G03F 7/20* (2013.01); *G03F 7/325* (2013.01); *H01J 37/32009* (2013.01)

(58) Field of Classification Search
CPC ............ G03F 7/36; G03F 7/20; G03F 7/325; H01J 37/32009; H01J 2924/00
USPC .......................................................... 216/48
See application file for complete search history.

(56) References Cited

U.S. PATENT DOCUMENTS

2015/0279657 A1* 10/2015 Wei .................. H01L 21/02494
438/478

* cited by examiner

*Primary Examiner* — Roberts Culbert
(74) *Attorney, Agent, or Firm* — ScienBiziP, P.C.

(57) ABSTRACT

The disclosure relates to a method of making a nano-pillar array on a substrate. A carbon nanotube composite structure is provided. The carbon nanotube composite structure defines a number of openings. The carbon nanotube composite structure is placed on the substrate. The substrate is dry etched to form a patterned surface by using the first surface using the carbon nanotube composite structure as a mask. The patterned surface includes a number of strip-shaped bulges crossed with each other. The carbon nanotube composite structure is removed. A photoresist layer is applied on the patterned surface. The photoresist layer is removed and some residual photoresist remains at intersections of the number of strip-shaped bulges. The substrate is further dry etched by using the residual photoresist as a mask.

20 Claims, 12 Drawing Sheets

METHOD FOR MAKING NANO-PILLAR ARRAY ON SUBSTRATE

CROSS-REFERENCE TO RELATED APPLICATIONS

This application claims all benefits accruing under 35 U.S.C. §119 from China Patent Application No. 201410660932.9, filed on Nov. 19, 2014, in the China Intellectual Property Office, disclosure of which is incorporated herein by reference.

FIELD

The subject matter herein generally relates to methods for making microstructure on a surface of substrate, in particular, to methods for making nano-pillar arrays on a surface of substrate based on carbon nanotubes.

BACKGROUND

Nanowires array are attracting more and more attention in nano research field because the excellent physical and electronic properties.

Usually, the method for making nano-pillar array is complicated and needs electron beam lithography, molecular beam epitaxy etc.. The methods above need large-scale equipment, and are complicated and difficult to make nano-pillar array.

What is needed, therefore, is to provide a method for solving the problem discussed above.

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

References will now be made to the drawings to describe, in detail, various embodiments of the present methods for making nano-pillar arrays on a surface of substrate based on carbon nanotubes.

Figure 1:
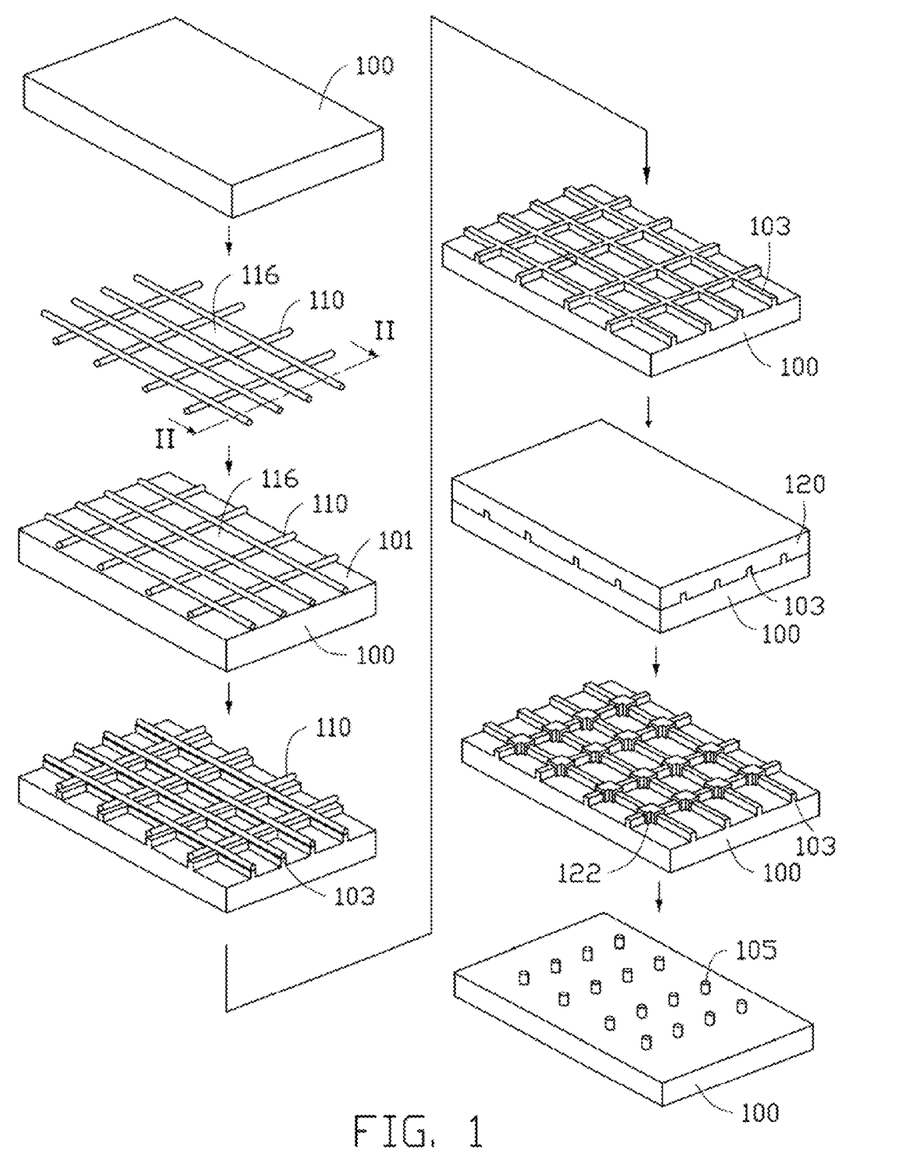
FIG. 1 is a flowchart of one embodiment of a method for making a nano-pillar array on a surface of a substrate.

Referring to FIG. 1, a method for making a nano-pillar array 105 on a surface of a substrate 100 of one embodiment includes the following steps: step (S10), providing the substrate 100;

step (S11), providing a carbon nanotube composite structure 110, wherein the carbon nanotube composite structure 110 includes a plurality of crossed carbon nanotubes and defines a plurality of openings 116;

step (S12), placing the carbon nanotube composite structure 110 on a surface 101 of the substrate 100, wherein parts of the surface 101 are exposed from the plurality of openings 116;

step (S13), forming a patterned surface 103 on the substrate 100 by dry etching the surface 101 using the carbon nanotube composite structure 110 as a first mask, wherein the patterned surface 103 includes a plurality of strip-shaped bulges crossed with each other;

step (S14), exposing the patterned surface 103 by removing the carbon nanotube composite structure 110;

step (S15), applying a photoresist layer 120 on the patterned surface 103;

step (S16), removing the photoresist layer 120 and obtaining some residual photoresist 122 at intersections of the plurality of strip-shaped bulges; and step (S17), dry etching the substrate 100 using the residual photoresist 122 as a second mask.

In step (S10), the material of the substrate 100 is not limited and can be metal, insulating material or semiconductor. The metal can be gold, aluminum, nickel, chromium, or copper. The insulating material can be silicon dioxide or silicon nitride. The semiconductor can be silicon, gallium nitride, or gallium arsenide. In one embodiment, the material of the substrate 100 is a gallium nitride layer with a thickness of 300 micrometers.

Figure 2:
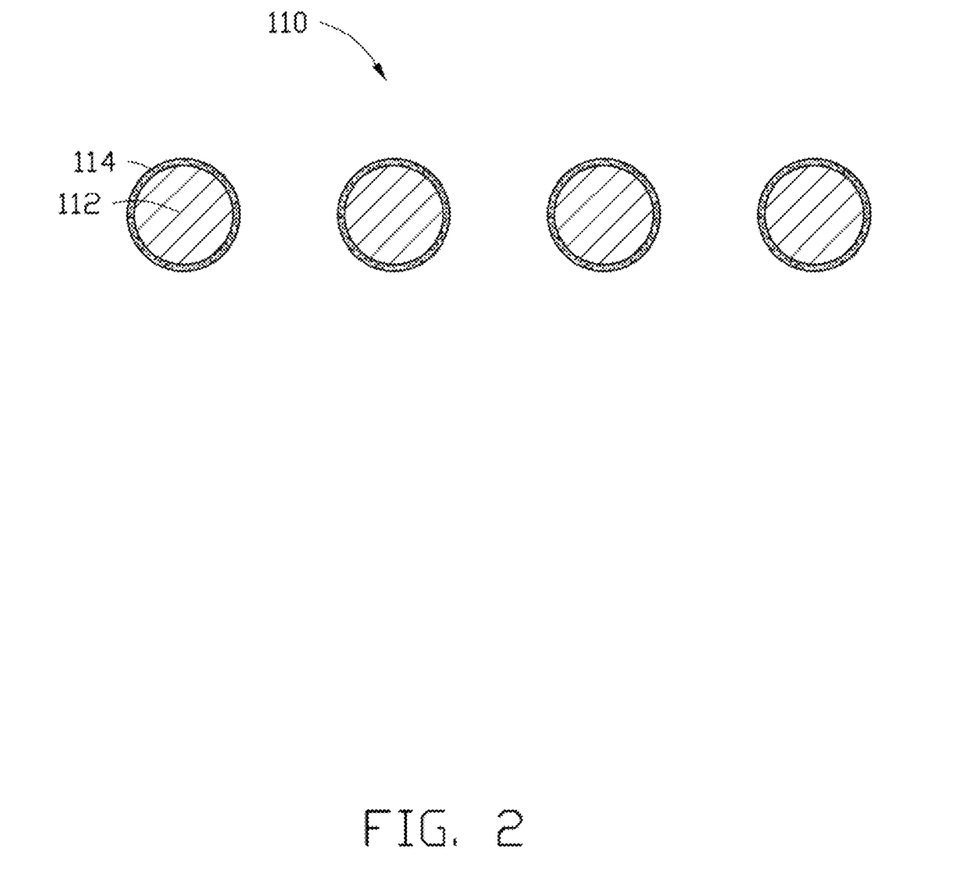
FIG. 2 is a cross-sectional view along line II-II of FIG. 1.

In step (S11), the carbon nanotube composite structure 110 includes a carbon nanotube structure 112 and a protective layer 114 coated on the carbon nanotube structure 112 as shown in FIG. 2. The carbon nanotube structure 112 is a free-standing structure. The term "free-standing structure" includes that the carbon nanotube structure 112 can sustain the weight of itself when it is hoisted by a portion thereof without any significant damage to its structural integrity. Thus, the carbon nanotube structure 112 can be suspended by two spaced supports.

The plurality of carbon nanotubes can be single-walled carbon nanotubes, double-walled carbon nanotubes, or multi-walled carbon nanotubes. The length and diameter of the plurality of carbon nanotubes can be selected according to need. The diameter of the single-walled carbon nanotubes can be in a range from about 0.5 nanometers to about 10 nanometers. The diameter of the double-walled carbon nanotubes can be in a range from about 1.0 nanometer to about 15 nanometers. The diameter of the multi-walled carbon nanotubes can be in a range from about 1.5 nanometers to about 50 nanometers. In one embodiment, the length of the carbon nanotubes can be in a range from about 200 micrometers to about 900 micrometers.

The plurality of carbon nanotubes are orderly arranged to form an ordered carbon nanotube structure. The plurality of carbon nanotubes extend along a direction substantially parallel to the surface of the carbon nanotube structure 112. The term 'ordered carbon nanotube structure' includes, but is not limited to, a structure wherein the plurality of carbon nanotubes are arranged in a consistently systematic manner, e.g., the plurality of carbon nanotubes are arranged approximately along the same direction.

The carbon nanotube structure 112 defines a plurality of apertures. The aperture extends throughout the carbon nanotube structure 112 along the thickness direction thereof The aperture can be a hole defined by several adjacent carbon nanotubes, or a gap defined by two substantially parallel carbon nanotubes and extending along axial direction of the carbon nanotubes. The hole shaped aperture and the gap shaped aperture can exist in the carbon nanotube structure 112 at the same time. Hereafter, the size of the aperture is the diameter of the hole or width of the gap. The sizes of the apertures can be different. The average size of the apertures can be in a range from about 10 nanometers to about 500 micrometers. For example, the sizes of the apertures can be about 50 nanometers, 100 nanometers, 500 nanometers, 1 micrometer, 10 micrometers, 80 micrometers, or 120 micrometers.

The carbon nanotube structure 112 can include at least one carbon nanotube film, at least one carbon nanotube wire, or combination thereof. In one embodiment, the carbon nanotube structure 112 can include a single carbon nanotube film or two or more carbon nanotube films stacked together. Thus, the thickness of the carbon nanotube structure 112 can be controlled by the number of the stacked carbon nanotube films. The number of the stacked carbon nanotube films can be in a range from about 2 to about 100. For example, the number of the stacked carbon nanotube films can be 10, 30, or 50. In one embodiment, the carbon nanotube structure 112 is formed by folding a single carbon nanotube wire. In one embodiment, the carbon nanotube structure 112 can include a layer of parallel and spaced carbon nanotube wires. Also, the carbon nanotube structure 112 can include a plurality of carbon nanotube wires crossed or weaved together to form a carbon nanotube net. The distance between two adjacent parallel and spaced carbon nanotube wires can be in a range from about 0.1 micrometers to about 200 micrometers. In one embodiment, the distance between two adjacent parallel and spaced carbon nanotube wires is in a range from about 10 micrometers to about 100 micrometers. The gap between two adjacent substantially parallel carbon nanotube wires is defined as the apertures. The size of the apertures can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 3:
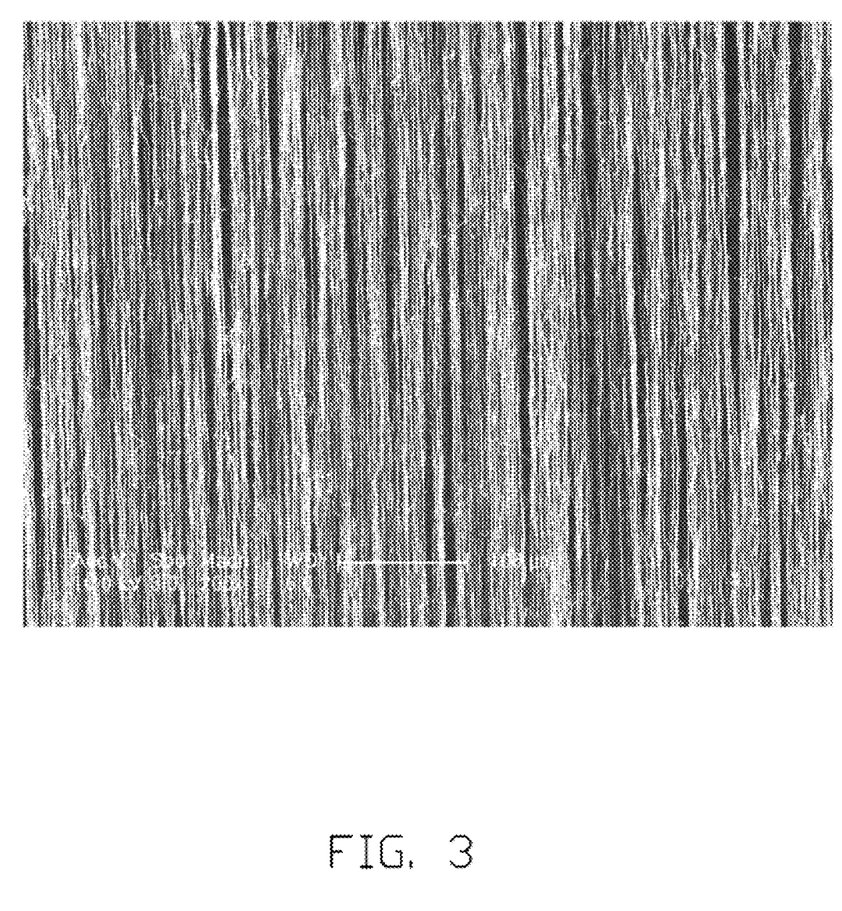
FIG. 3 is a Scanning Electron Microscope (SEM) image of a drawn carbon nanotube film of one embodiment.

In one embodiment, the carbon nanotube structure 112 includes at least one drawn carbon nanotube film. The drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIG. 3, each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. As can be seen in FIG. 3, some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness and reduce the coefficient of friction of the drawn carbon nanotube film. A thickness of the drawn carbon nanotube film can range from about 0.5 nanometers to about 100 micrometers. The drawn carbon nanotube film defines a plurality of apertures between adjacent carbon nanotubes.

The carbon nanotube structure 112 can include at least two stacked drawn carbon nanotube films. In other embodiments, the carbon nanotube structure 112 can include two or more coplanar carbon nanotube films, and can include layers of coplanar carbon nanotube films. Additionally, when the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films can be combined by only the van der Waals attractive force therebetween. An angle between the aligned directions of the carbon nanotubes in two adjacent carbon nanotube films can range from about 0 degrees to about 90 degrees. When the angle between the aligned directions of the carbon nanotubes in adjacent stacked drawn carbon nanotube films is larger than 0 degrees, a plurality of micropores is defined by the carbon nanotube structure 112. In one embodiment, the carbon nanotube structure 112 has the aligned directions of the carbon nanotubes between adjacent stacked drawn carbon nanotube films at 90 degrees. Stacking the carbon nanotube films will also add to the structural integrity of the carbon nanotube structure 112.

Figure 4:
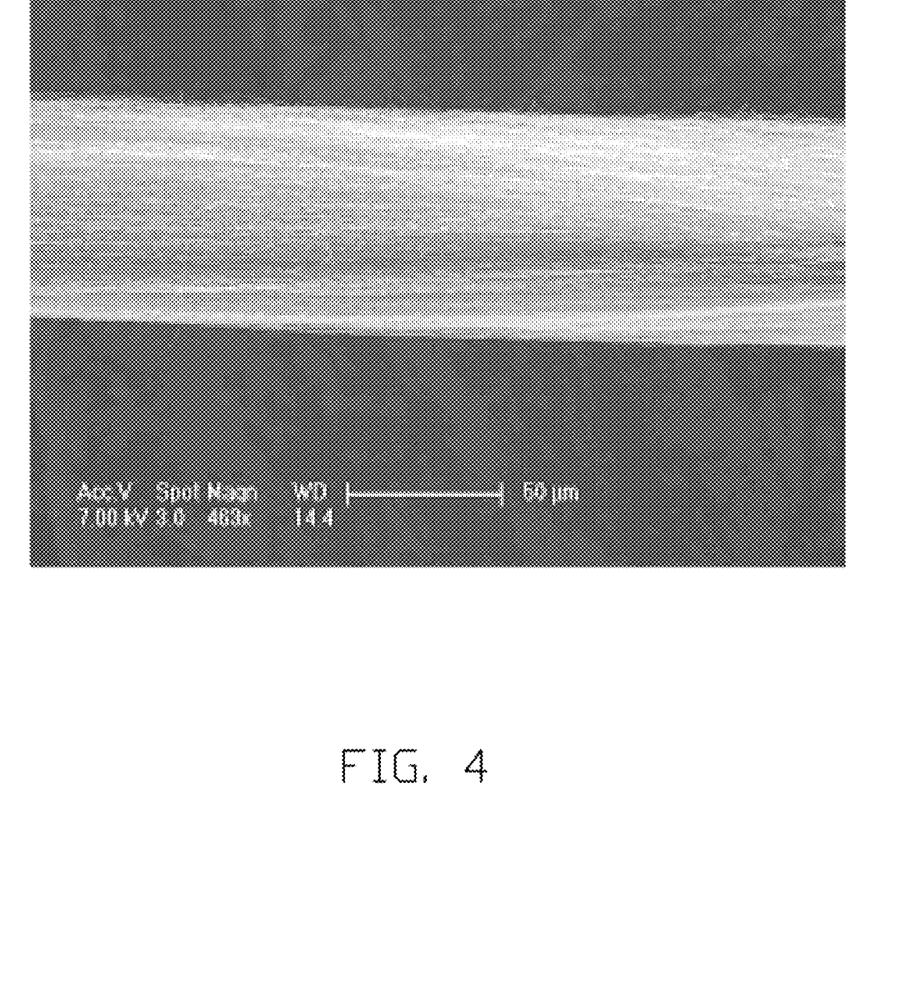
FIG. 4 is an SEM image of an untwisted carbon nanotube wire of one embodiment.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes, and thus, the drawn carbon nanotube film will be shrunk into an untwisted carbon nanotube wire. Referring to FIG. 4, the untwisted carbon nanotube wire includes a plurality of carbon nanotubes substantially oriented along the same direction (i.e., a direction along the length of the untwisted carbon nanotube wire). The carbon nanotubes are substantially parallel to the axis of the untwisted carbon nanotube wire. More specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. The length of the untwisted carbon nanotube wire can be arbitrarily set as desired. A diameter of the untwisted carbon nanotube wire ranges from about 0.5 nanometers to about 100 micrometers.

Figure 5:
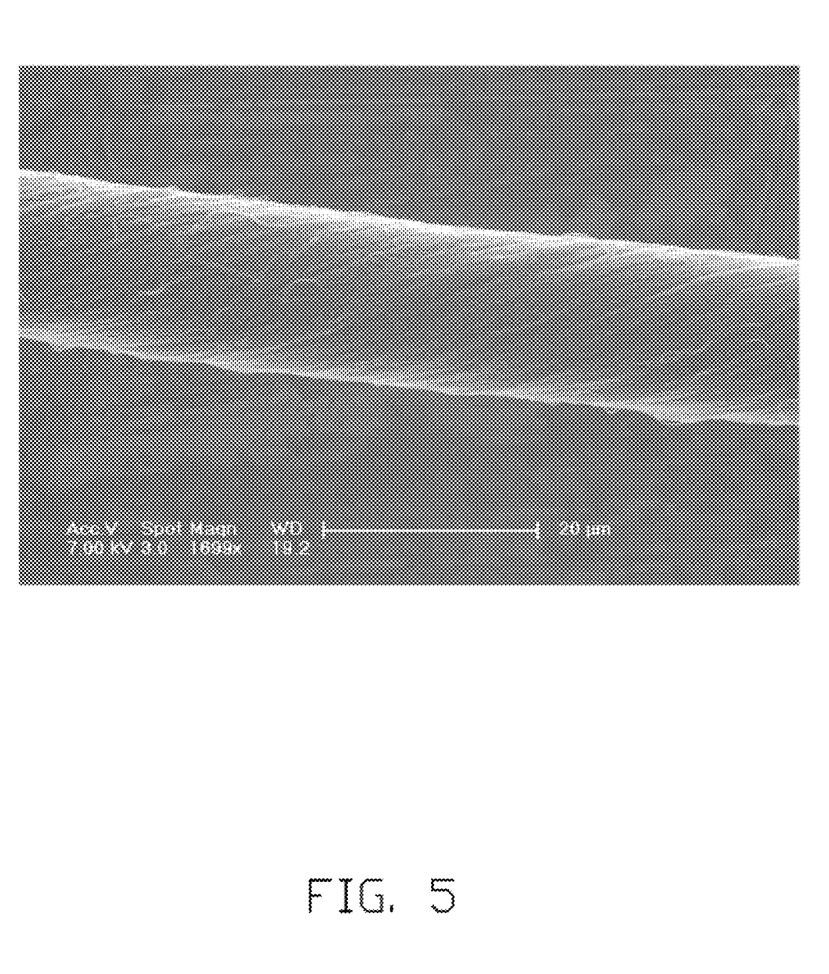
FIG. 5 is an SEM image of a twisted carbon nanotube wire of one embodiment.

The twisted carbon nanotube wire can be formed by twisting a drawn carbon nanotube film using a mechanical force to turn the two ends of the drawn carbon nanotube film in opposite directions. Referring to FIG. 5, the twisted carbon nanotube wire includes a plurality of carbon nanotubes helically oriented around an axial direction of the twisted carbon nanotube wire. More specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. The length of the carbon nanotube wire can be set as desired. A diameter of the twisted carbon nanotube wire can be from about 0.5 nanometers to about 100 micrometers. Further, the twisted carbon nanotube wire can be treated with a volatile organic solvent after being twisted to bundle the adjacent paralleled carbon nanotubes together. The specific surface area of the twisted carbon nanotube wire will decrease, while the density and strength of the twisted carbon nanotube wire will increase.

In step (S11), carbon nanotube composite structure 110 can be made by applying a protective layer 114 on a surface of the carbon nanotube structure 112. The carbon nanotube structure 112 can be suspended in a depositing chamber during depositing the protective layer 114 so that two opposite surfaces of the carbon nanotube structure 112 are coated with the protective layer 114. In some embodiments, each of the plurality of carbon nanotubes is fully enclosed by the protective layer 114. In one embodiment, the carbon nanotube structure 112 is located on a frame so that the middle portion of the carbon nanotube structure 112 is suspended through the through hole of the frame. The frame can be any shape, such as a quadrilateral. The carbon nanotube structure 112 can also be suspended by a metal mesh or metal ring.

The method of depositing the protective layer 114 can be physical vapor deposition (PVD), chemical vapor deposition (CVD), atomic layer deposition (ALD), magnetron sputtering, or spraying.

The plurality of openings 116 are formed because of the plurality of apertures of the carbon nanotube structure 112. The plurality of openings 116 and the plurality of apertures have the same shape and different size. The size of the plurality of openings 116 is smaller than that of the plurality of apertures because the protective layer 114 is deposited in the plurality of apertures.

The thickness of the protective layer 114 is in a range from about 3 nanometers to about 50 nanometers. In one embodiment, the thickness of the protective layer 114 is in a range from about 3 nanometers to about 20 nanometers. If the thickness of the protective layer 114 is less than 3 nanometers, the protective layer 114 cannot prevent the carbon nanotubes from being destroyed in following etching process. If the thickness of the protective layer 114 is greater than 50 nanometers, the plurality of apertures may be fully filled by the protective layer 114 and the plurality of openings 116 cannot be obtained.

The material of the protective layer 114 can be metal, metal oxide, metal nitride, metal carbide, metal sulfide, silicon oxide, silicon nitride, or silicon carbide. The metal can be gold, nickel, titanium, iron, aluminum, titanium, chromium, or alloy thereof The metal oxide can be alumina, magnesium oxide, zinc oxide, or hafnium oxide. The material of the protective layer 114 is not limited above and can be any material as long as the material can be deposited on the carbon nanotube structure 112, would not react with the carbon nanotubes and would not be etched easily in following drying etching process. The protective layer 114 is combined with the carbon nanotube structure 112 by van der Waals attractive force therebetween only.

Figure 6:
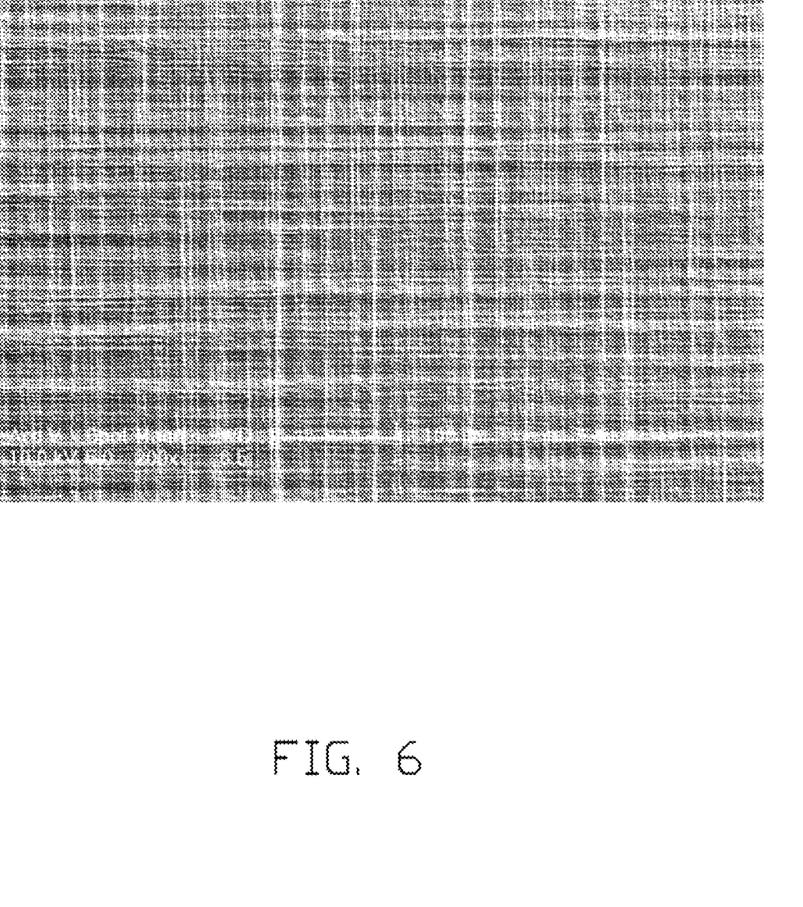
FIG. 6 is an SEM image of a carbon nanotube composite structure with cross-stacked drawn carbon nanotube films of one embodiment.

As shown in FIG. 6, in one embodiment, an alumina layer of 5 nanometers thickness is deposited on two stacked drawn carbon nanotube films by electron beam evaporation. The aligned direction of the carbon nanotubes between adjacent stacked drawn carbon nanotube films is 90 degrees.

In step (S12), the carbon nanotube composite structure 110 can be in direct contact with the surface 101 of the substrate 100 or suspended above the surface 101 of the substrate 100 by a support. In one embodiment, the carbon nanotube composite structure 110 is transferred on the surface 101 of the substrate 100 through the frame.

Furthermore, the placing the carbon nanotube composite structure 110 on the surface 101 comprises solvent treating the substrate 100 with the carbon nanotube composite structure 110 thereon. Because there is air between the carbon nanotube composite structure 110 and the surface 101 of the substrate 100, the solvent treating can exhaust the air and allow the carbon nanotube composite structure 110 to be closely and firmly adhered on the surface 101 of the substrate 100. The solvent treating can be applying a solvent to entire surface of the carbon nanotube composite structure 110 or immersing the entire substrate 100 with the carbon nanotube composite structure 110 in a solvent. The solvent can be water or volatile organic solvent such as ethanol, methanol, acetone, dichloroethane, chloroform, or mixtures thereof In one embodiment, the organic solvent is ethanol.

In the step (S13), the dry etching can be plasma etching or reactive ion etching (RIE). In one embodiment, the dry etching is performed by applying plasma energy on the entire or part surface of the surface 101 via a plasma device. The plasma gas can be an inert gas and/or etching gases, such as argon (Ar), helium (He), chlorine ($Cl_2$), hydrogen ($H_2$), oxygen ($O_2$), fluorocarbon ($CF_4$), ammonia ($NH_3$), or air.

In one embodiment, the plasma gas is a mixture of chlorine and argon. The power of the plasma device can be in a range from about 20 watts to about 70 watts. The plasma flow of chlorine can be in a range from about 5 sccm to about 20 sccm, such as 10 sccm. The plasma flow of argon can be in a range from about 15 sccm to about 40 sccm, such as 25 sccm. When the plasma is produced in vacuum, the work pressure of the plasma can be in a range from about 3 Pa to 10 Pa, such as 6 Pa. The time for plasma etching can be in a range from about 10 seconds to about 20 seconds, such as 15 seconds.

In the plasma etching process, the plasma gas would react with the exposed portion of the substrate 100 and would not react with the protective layer 114, or reaction between the plasma gas and the protective layer 114 is much slower than reaction between the plasma gas and the substrate 100. The selection relationship of the plasma gas, material of the substrate 100 and material of the protective layer 114 is shown in Table 1 below.

TABLE 1

| Number | Substrate | protective layer | Plasma gas |
|---|---|---|---|
| 1 | Al | $SiO_2$ | $Cl_2$ or $BCl_3$ |
| 2 | $SiO_2$ | Al, Cr, Fe, Ti, Ni, or Au | $CF_4$ |
| 3 | $SiN_x$ | Al, Cr, Fe, Ti, Ni, or Au | $CF_4$ |
| 4 | GaN | $Al_2O_3$ | $Cl_2$ or $Ar_2$ |
| 5 | Au, Cr or Ni | $SiO_2$ or $SiN_x$ | $O_2$ or $Ar_2$ |
| 6 | Cu | $SiO_2$ or $SiN_x$ | $O_2$ or $BCl_3$ |

In the etching process, the etching gas reacts with the substrate 100, but does not react with the protective layer 114 or react with the protective layer 114 at a speed much less than that of the reaction between the etching gas and the substrate 100. Thus, the exposed portion of the substrate 100 would be etched gradually and the portion of the substrate 100 that are shielded by the carbon nanotube composite structure 110 would not be etched.

Figure 7:
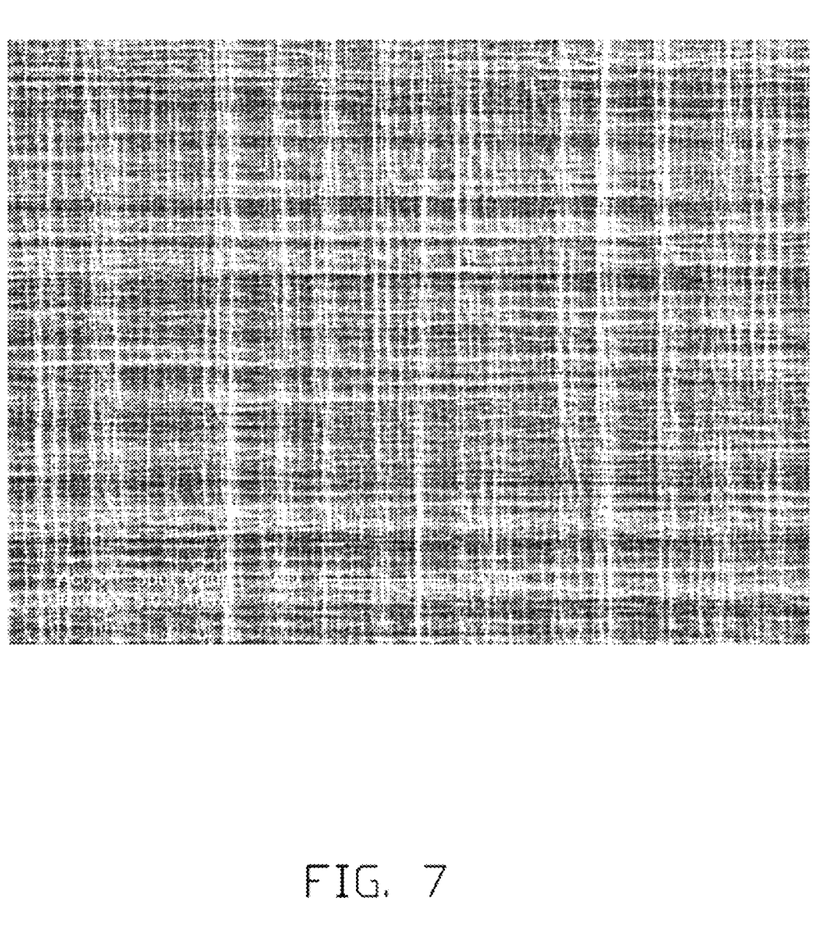
FIG. 7 is an SEM image of a patterned surface fabricated by a method of one embodiment.

The patterned surface 103 and the carbon nanotube composite structure 110 substantially have the same pattern as shown in FIG. 6-7. When the carbon nanotube structure 112 includes a plurality of crossed drawn carbon nanotube films, the patterned surface 103 includes a plurality of strip-shaped bulges crossed with each other.

The width of the strip-shaped bulges can be in a range from about 20 nanometers to about 150 nanometers. In one embodiment, the width of the strip-shaped bulges can be in a range from about 20 nanometers to about 100 nanometers. In one embodiment, the width of the strip-shaped bulges can be in a range from about 50 nanometers to about 100 nanometers. The distance between adjacent two of the strip-shaped bulges can be in a range from about 10 nanometers to about 300 nanometers. In one embodiment, the distance between adjacent two of the strip-shaped bulges can be in a range from about 10 nanometers to about 100 nanometers. In one embodiment, the distance between adjacent two of the strip-shaped bulges can be in a range from about 100 nanometers to about 200 nanometers. The height of the strip-shaped bulge is determined by the etching time and can be in a range from about 10 nanometers to about 100 nanometers. In one embodiment, the height of the strip-shaped bulge can be in a range from about 50 nanometers to about 60 nanometers. In one embodiment, the patterned surface 103 includes a plurality of strip-shaped bulges crossed with each other.

In step (S14), the method of removing the carbon nanotube composite structure 110 can be ultrasonic method, or adhesive tape peeling, oxidation. In one embodiment, the substrate 100 with the carbon nanotube composite structure 110 thereon is placed in an N-methyl pyrrolidone solution and ultrasonic treating for several minutes.

In step (S15), the method for applying the photoresist layer 120 can be spin coating, immersion coating or vapor deposition. The method for applying the photoresist layer 120 is not limited as long as the photoresist layer 120 can be formed on the patterned surface 103. The thickness of the photoresist layer 120 can be in a range from about 1 micrometer to about 3 micrometers. In one embodiment, the photoresist layer 120 with a thickness of 1.5 micrometers is applied on the patterned surface 103 by spin coating.

In step (S16), the method for removing the photoresist layer 120 can be exposure and development. In one embodiment, the photoresist layer 120 is first exposed to the ultraviolet (UV) light for a time in a range from about 10 seconds to about 30 seconds and then developed in a sodium hydroxide (NaOH) solution of 0.05 mol/L~0.3 mol/L concentration. The sodium hydroxide solution can remove most of the photoresist layer 120 on the patterned surface 103. Some of the photoresist layer 120 that are at intersections of the plurality of strip-shaped bulges remains as the residual photoresist 122. In a comparative embodiment, the substrate 100, after photoresist layer 120 being exposed to the ultraviolet light and developed in the sodium hydroxide solution, is further soaked in an acetone for 12 hours. However, after being soaked in the acetone for 12 hours, it cannot obtain nano-pillar array 105 on the substrate 100 in following dry etching steps. Therefore, the residual photoresist 122 is critical for making the nano-pillar array 105 on the substrate 100. Furthermore, the photoresist layer 120 can be partially exposed to the ultraviolet light so as to make the nano-pillar array 105 on only part of the substrate 100.

In another embodiment, the method for removing the photoresist layer 120 can be directly soaking the photoresist layer 120 in the acetone for a time in a range from about several seconds to about several hours without any exposure. Usually, it needs to soak the photoresist layer 120 in the acetone for a time more than 10 hours to completely remove the photoresist layer 120. Therefore, it can only remove most of the photoresist layer 120 on the patterned surface 103 by directly soaking the photoresist layer 120 in the acetone for a time less than 10 hours. Some of the photoresist layer 120 that are at intersections of the plurality of strip-shaped bulges remains as the residual photoresist 122. In one embodiment, the photoresist layer 120 is directly soaked in the acetone for 20 seconds and the nano-pillar array 105 can be formed on the substrate 100 in following dry etching steps. In one embodiment, the photoresist layer 120 is directly soaked in the acetone for 5 hours, and the nano-pillar array 105 can also be formed on the substrate 100 in following dry etching steps. The density of the nano-pillar array 105 will be affected by the soaking time. The longer the photoresist layer 120 is soaked in the acetone, the less residual photoresist 122 will remain. Thus, the smaller the density of the nano-pillar array 105 will be.

Because the photoresist layer 120 has larger contacting surfaces with the patterned surface 103 at intersections of the plurality of strip-shaped bulges, it is easy for some of the photoresist layer 120 that are at intersections of the plurality of strip-shaped bulges to remain as the residual photoresist 122.

In step (S17), the method for dry etching the substrate 100 using the residual photoresist 122 as mask is the same as the dry etching of step (S13). Usually, the dry etching in step (S17) has greater power and longer etching time that that of step (S13). In one embodiment, the plasma gas in step (S17) is a mixture of chlorine and argon. The power of the plasma device can be in a range from about 20 watts to about 70 watts. The plasma flow of chlorine can be in a range from about 10 sccm to about 20 sccm, such as 10 sccm. The plasma flow of argon can be in a range from about 25 sccm to about 35 sccm, such as 30 sccm. When the plasma is produced in vacuum, the work pressure of the plasma can be in a range from about 5Pa to 10 Pa. The time for plasma etching can be in a range from about 3 minutes to about 10 minutes.

Because the intersections of the strip-shaped bulges are shielded by the residual photoresist 122 and other parts of the strip-shaped bulges are exposed, the exposed parts of the strip-shaped bulges will be etched. Thus, a plurality of nano-pillars are formed at the intersections of the strip-shaped bulges to form the nano-pillar array 105. Each of the plurality of nano-pillars corresponds to one intersection of the crossed carbon nanotubes of the carbon nanotube composite structure 110. By changing the angle between the crossed carbon nanotubes or adjusting the intersections placements of the crossed carbon nanotubes, the density and distribution of the nano-pillar array 105 can be controlled. The method for making the nano-pillar array 105 is simple, low coast, and can make the nano-pillar array 105 in mass.

Figure 8:
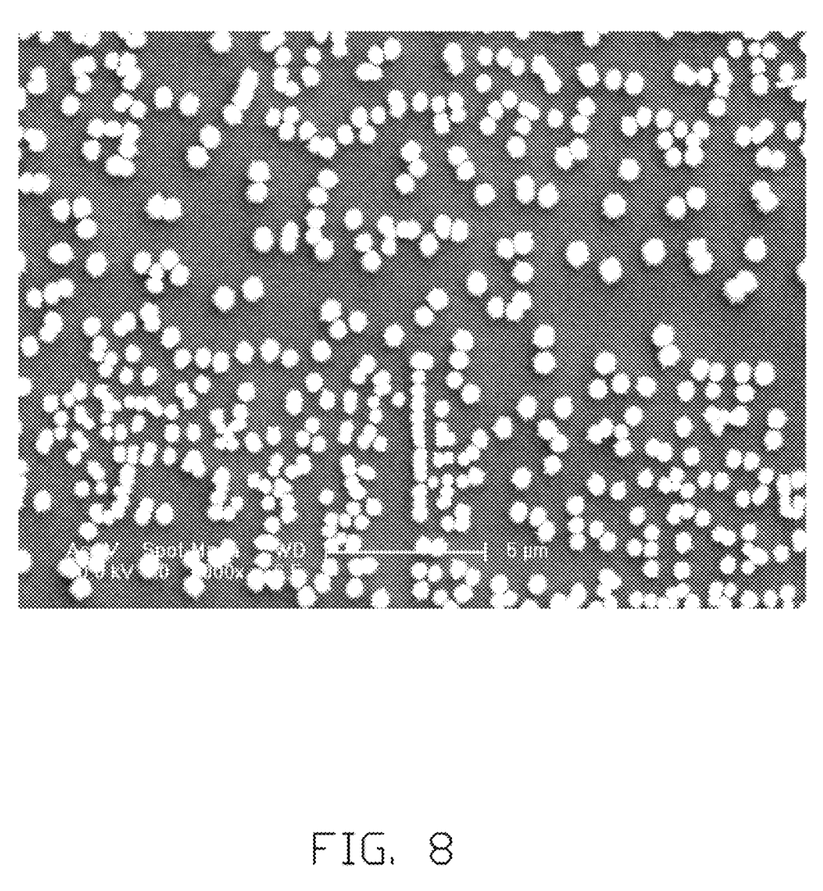
FIG. 8 is a top view SEM image of a nano-pillar array fabricated by a method of one embodiment.
Figure 9:
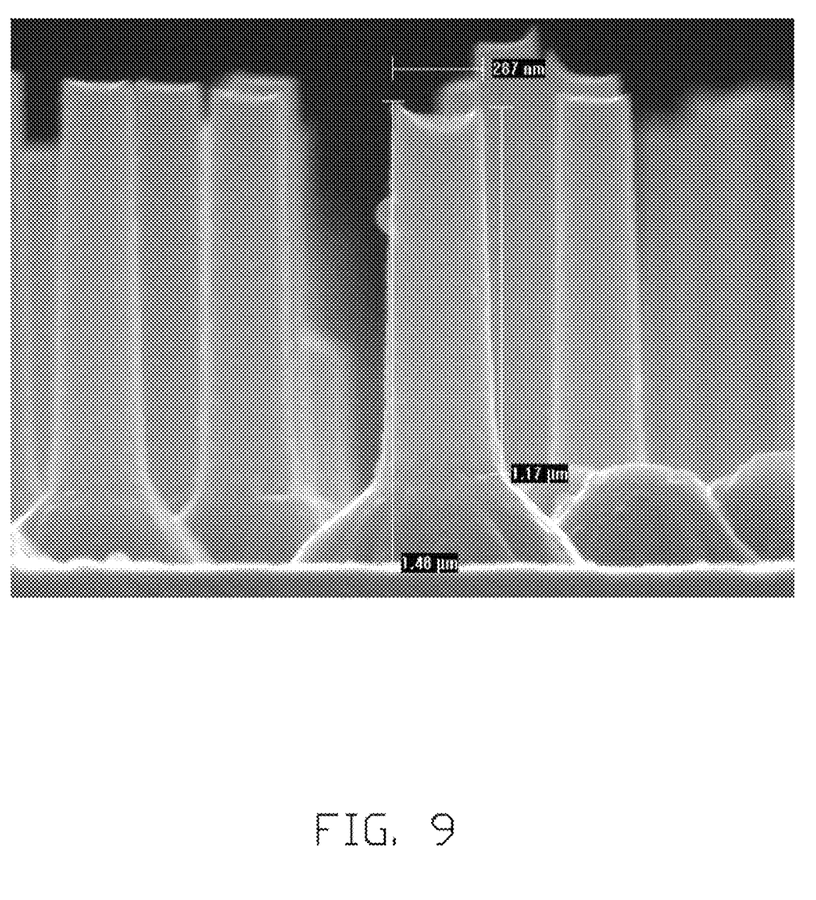
FIG. 9 is a side view SEM image of a nano-pillar array fabricated by a method of one embodiment.

As shows in FIG. 8, the plurality of nano-pillars are distributed on the substrate. As shows in FIG. 9, the plurality of nano-pillars are substantially parallel with, spaced from each other and perpendicular with the substrate. Each of the plurality of nano-pillars includes a half spherical plinth and a column located on the plinth. The height of the plinth is in a range from about 0.2 micrometer to about 0.5 micrometer. The height of the column is in a range from about 0.5 micrometers to about 2.5 micrometers. The diameter of the column is in a range from about 100 nanometers to about 300 nanometers. The ratio of the length to diameter of the column is greater than 4:1, such as greater than 8:1. In one embodiment, the height of the plinth is 0.31 micrometers, the height of the column is 1.17 micrometers, and the diameter of the column is 287 nanometers.

Figure 10:
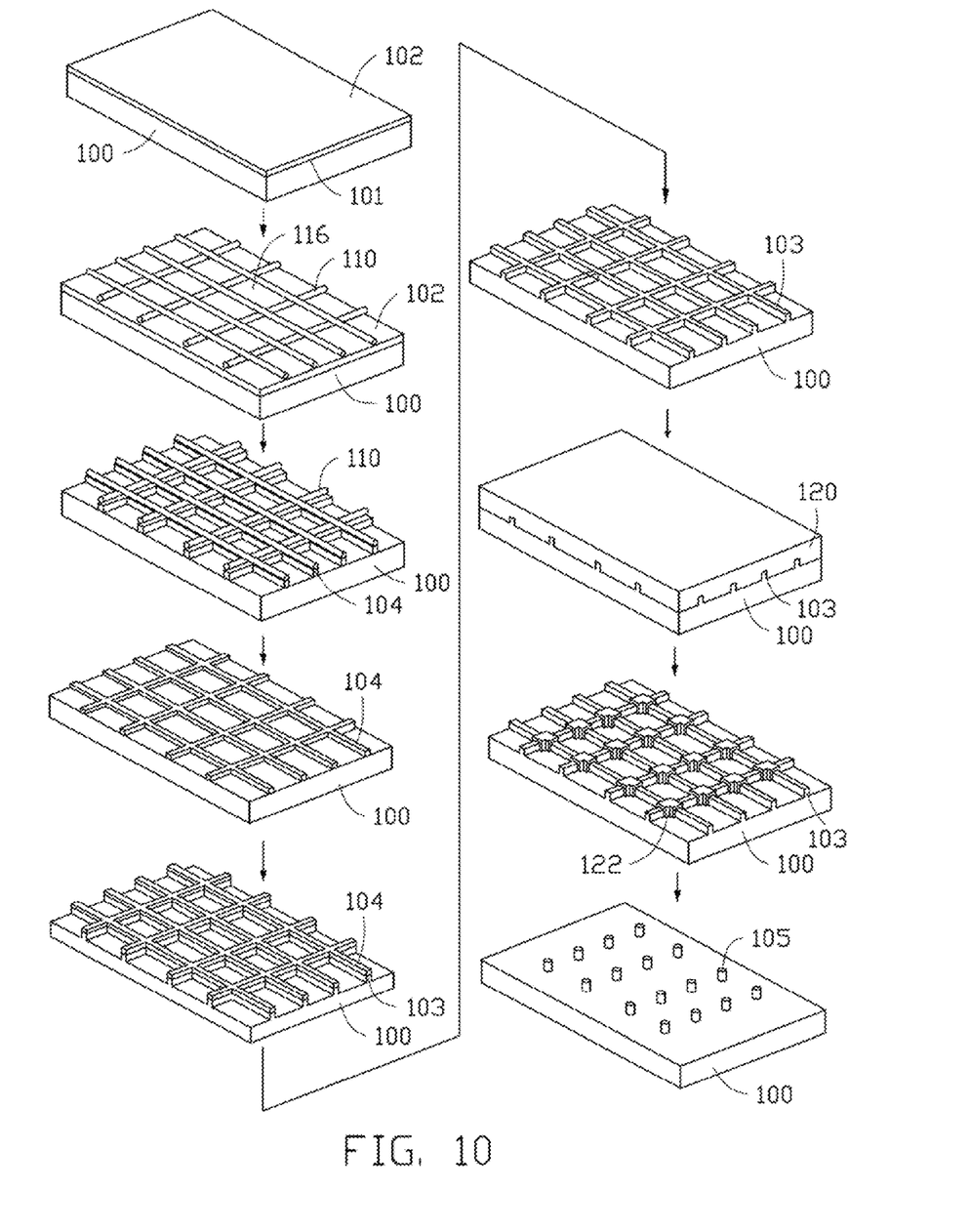
FIG. 10 is a flowchart of another embodiment of a method for making a nano-pillar array on a surface of a substrate.

Referring to FIG. 10, a method for making a nano-pillar array 105 on a surface of a substrate 100 of one embodiment includes the following steps:

step (S20), applying a transition layer 102 on the surface 101 of the substrate 100;

step (S21), placing the carbon nanotube composite structure 110 on the transition layer 102, wherein parts of the transition layer 102 are exposed from the plurality of openings 116;

step (S22), forming a patterned transition layer 104 on the substrate 100 by dry etching the transition layer 102 using the carbon nanotube composite structure 110 as a first mask;

step (S23), exposing the patterned transition layer 104 by removing the carbon nanotube composite structure 110;

step (S24), forming a patterned surface 103 on the substrate 100 by dry etching the surface 101 using the patterned transition layer 104 as a second mask, wherein the patterned surface 103 includes a plurality of strip-shaped bulges crossed with each other;

step (S25), exposing the patterned surface 103 by removing the patterned transition layer 104;

step (S26), applying a photoresist layer 120 on the patterned surface 103;

step (S27), removing the photoresist layer 120 and obtaining some residual photoresist 122 at intersections of the plurality of strip-shaped bulges; and step (S28), dry etching the substrate 100 using the residual photoresist 122 as a third mask.

The method of FIG. 10 is similar as the method of FIG. 1 except that the pattern of the carbon nanotube composite structure 110 is transferred on the transition layer 102 to form the patterned transition layer 104 first, and then the pattern of the patterned transition layer 104 is transferred on surface 101 of the substrate 100 to form the patterned surface 103. Usually, long time and high temperatures are required to dry etch the surface 101 of the substrate 100 in order to make the patterned surface 103. If the carbon nanotube composite structure 110 is used as the mask to directly dry etch the surface 101 of the substrate 100, the carbon nanotube composite structure 110 would be damaged and attached on the substrate 100 closely and firmly. Thus, it would be hard to remove the carbon nanotube composite structure 110.

In step (S20), the material of the transition layer 102 is not limited and can be any material that can be deposited on the surface 101 and etched by the dry etching. The material of the transition layer 102 can be hafnium oxide, alumina, silica, aluminum, or gold. The shape, thickness and size of the transition layer 102 are not limited. In one embodiment, the substrate 100 is a gallium arsenide layer with a thickness of 300 micrometers, and the transition layer 102 is a silicon dioxide layer with a thickness of 20 nanometers. The silicon dioxide layer cover entire surface 101 of the gallium arsenide layer.

In step (S22), the method of dry etching the transition layer 102 is the same as the dry etching of step (S13). The etching gas reacts with the exposed transition layer 102, but does not react with the protective layer 114 or react with the protective layer 114 at a speed much less than that of the reaction between the etching gas and the transition layer 102. The pattern of the patterned transition layer 104 is the same as that of the carbon nanotube composite structure 110.

In one embodiment, the plasma gas for etching the transition layer 102 is $CF_4$. The power of the plasma device can be in a range from about 30 watts to about 50 watts. The plasma flow of $CF_4$ can be in a range from about 30 sccm to about 50 sccm. When the plasma is produced in vacuum, the work pressure of the plasma can be in a range from about 1.5 Pa to 3 Pa. The time for plasma etching can be in a range from about 5 seconds to about 20 seconds.

In one embodiment, the patterned transition layer 104 includes a plurality of nano-bars crossed with each other to form a net structure. The patterned transition layer 104 defines a plurality of opening to expose parts of the surface 101. The width of the nano-bar can be in a range from about 20 nanometers to about 150 nanometers, such as from about 20 nanometers to about 100 nanometers. The distance between adjacent two of the nano-bars can be in a range from about 10 nanometers to about 300 nanometers, such as from about 20 nanometers to about 100 nanometers. The height of the nano-bar is the same as the thickness of the transition layer 102.

In step (S24), the method of dry etching the surface 101 is the same as the dry etching of step (S13). The etching gas reacts with the exposed surface 101, but does not react with the patterned transition layer 104 or react with the patterned transition layer 104 at a speed much less than that of the reaction between the etching gas and the surface 101. The pattern of the patterned surface 103 is the same as that of the carbon nanotube composite structure 110 and the patterned transition layer 104.

The selection relationship of the plasma gas, material of the substrate 100, material of the transition layer 102 and material of the protective layer 114 is shown in Table 2 below.

TABLE 2

| Number | Substrate | Transition layer | Protective layer | Plasma gas for etching transition layer | Plasma gas for etching substrate |
|---|---|---|---|---|---|
| 1 | Au | $SiO_2$ | Al | $CF_4$ | Ar and $O_2$ |
| 2 | Au | $Al_2O_3$ | Al | $BCl_3$ | Ar and $O_2$ |
| 3 | Au | $HfO_2$ | Al | $BCl_3$ | Ar and $O_2$ |
| 4 | Cu | $SiO_2$ | Al | $CF_4$ | $BCl_3$ and $O_2$ |
| 5 | Cu | $Al_2O_3$ | Al | $BCl_3$ | $BCl_3$ and $O_2$ |
| 6 | Cu | $HfO_2$ | Al | $BCl_3$ | $BCl_3$ and $O_2$ |
| 7 | $SiO_2$, $SiN_2$ | $Al_3O_3$ | Al, Cr, Fe, Ti, Ni or Au | $BCl_3$ and $O_2$ | $CF_4$ |
| 8 | GaN, GaAs | $SiO_2$ | $Al_2O_3$ | $CF_4$ | $Cl_2$ and $Ar_2$ |
| 9 | Cr, Ni | $Al_2O_3$ | $SiO_2$ or $SiN_x$ | $BCl_3$ and $O_2$ | $O_2$ and $Ar_2$ |

In step (S25), the method of removing the patterned transition layer 104 can be wet etching. In one embodiment, the patterned transition layer 104 is removed by etching in a hydrofluoric (HF) acid solution. In one embodiment, the patterned transition layer 104 is removed by etching in a mixture solution of HF acid and $NH_4F$ inhibitor agent with a ratio of HF:$NH_4F$=1:7.

Figure 11:
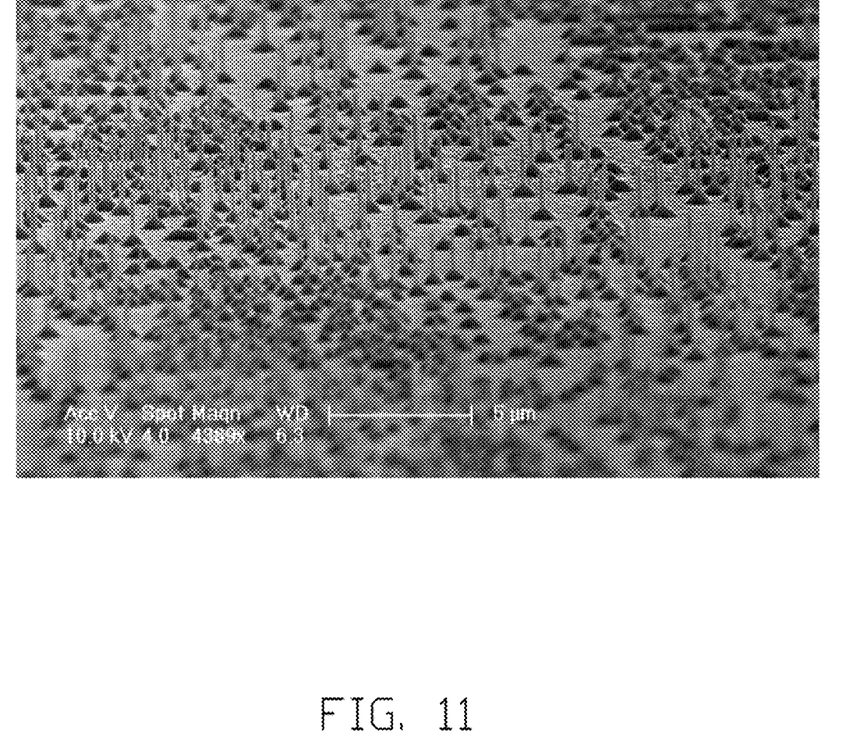
FIG. 11 is a side view SEM image of a nano-pillar array fabricated by a method of one embodiment.
Figure 12:
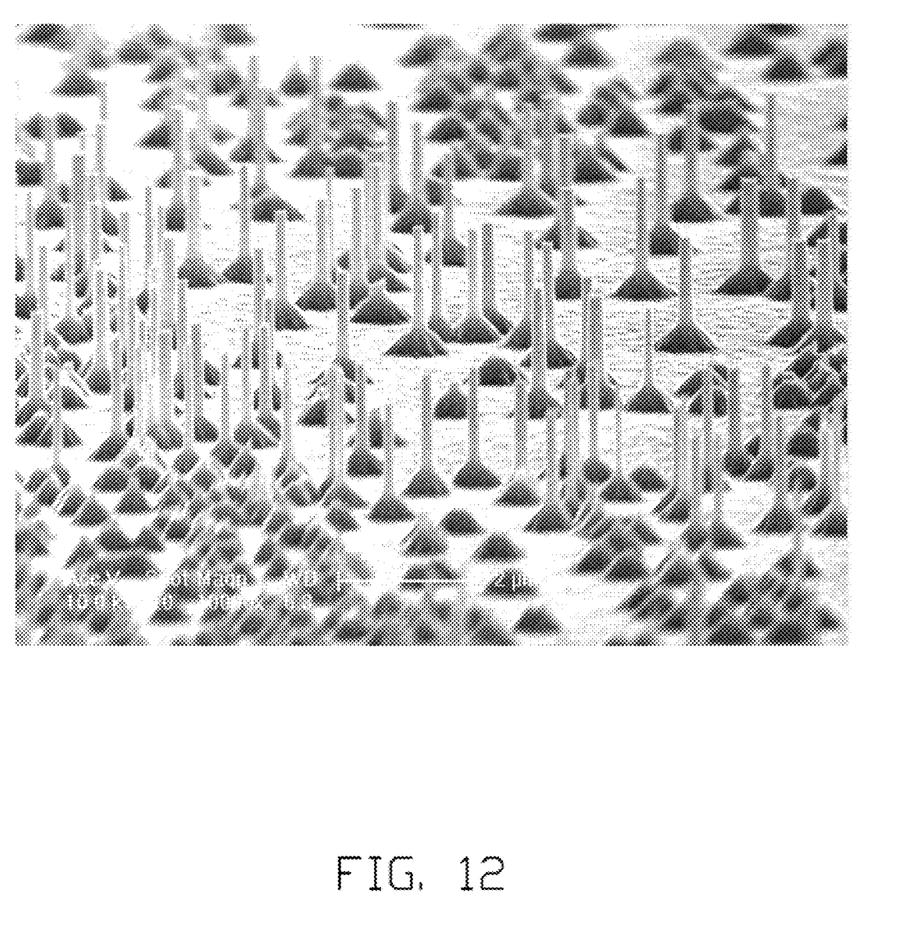
FIG. 12 is an enlarged side view SEM image of a nano-pillar array of FIG. 11.

As shows in FIGS. 11-12, the plurality of nano-pillars are substantially parallel with, spaced from each other and perpendicular with the substrate. Each of the plurality of nano-pillars comprises a half spherical plinth and a column located on the plinth. The ratio of the length to diameter of the column is greater than 6:1.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A method for making a nano-pillar array on a substrate, the method comprising:
    providing a carbon nanotube composite structure, wherein the carbon nanotube composite structure comprises a plurality of carbon nanotubes crossed with each other and defines a plurality of openings;
    placing the carbon nanotube composite structure on a first surface of the substrate, wherein parts of the first surface are exposed from the plurality of openings;
    forming a patterned surface on the substrate by dry etching the first surface using the carbon nanotube composite structure as a first mask, wherein the patterned surface comprises a plurality of strip-shaped bulges crossed with each other;
    exposing the patterned surface by removing the carbon nanotube composite structure;
    applying a photoresist layer on the patterned surface;
    removing the photoresist layer and obtaining some residual photoresist at intersections of the plurality of strip-shaped bulges; and
    dry etching the substrate using the residual photoresist as a second mask.

2. The method of claim 1, wherein the carbon nanotube composite structure comprises a carbon nanotube structure comprising the plurality of carbon nanotubes and a protective layer coated on each of the plurality of carbon nanotubes.

3. The method of claim 2, wherein the carbon nanotube structure comprises a first carbon nanotube film and a second carbon nanotube film stacked with each other.

4. The method of claim 3, wherein the first carbon nanotube film comprises a plurality of first carbon nanotubes that are joined end-to-end by van der Waals attractive force therebetween and substantially arranged along the same first direction; the second carbon nanotube film comprises a plurality of second carbon nanotubes that are joined end-to-end by van der Waals attractive force therebetween and substantially arranged along the same second direction; and the second direction is different from the first direction.

5. The method of claim 2, wherein the providing the carbon nanotube composite structure comprises suspending the carbon nanotube structure and applying the protective layer on the carbon nanotube structure.

6. The method of claim 5, wherein each of the plurality of carbon nanotubes is fully enclosed by the protective layer.

7. The method of claim 2, wherein a thickness of the protective layer is in a range from about 3 nanometers to about 50 nanometers.

8. The method of claim 7, wherein the thickness of the protective layer is in a range from about 3 nanometers to about 20 nanometers.

9. The method of claim 2, wherein the protective layer comprises a material selected from the group consisting of metal, metal oxide, metal nitride, metal carbide, metal sulfide, silicon oxide, silicon nitride, and silicon carbide.

10. The method of claim 1, wherein each dry etching is plasma etching or reactive ion etching.

11. The method of claim 1, wherein the removing the photoresist layer comprises exposure and development.

12. The method of claim 1, wherein the removing the photoresist layer comprises soaking the photoresist layer in acetone for a time less than 10 hours.

13. A method for making a nano-pillar array on a substrate, the method comprising:
    applying a transition layer on a first surface of the substrate;
    providing a carbon nanotube composite structure, wherein the carbon nanotube composite structure comprises a plurality of carbon nanotubes crossed with each other and defines a plurality of openings;
    placing the carbon nanotube composite structure on the transition layer, wherein parts of the transition layer are exposed from the plurality of openings;
    forming a patterned transition layer on the substrate by dry etching the transition layer using the carbon nanotube composite structure as a first mask;
    exposing the patterned transition layer by removing the carbon nanotube composite structure;
    forming a patterned surface on the substrate by dry etching the first surface using the patterned transition layer as a second mask, wherein the patterned surface comprises a plurality of strip-shaped bulges crossed with each other;
    exposing the patterned surface by removing the patterned transition layer;
    applying a photoresist layer on the patterned surface;
    removing the photoresist layer and obtaining some residual photoresist at intersections of the plurality of strip-shaped bulges; and
    dry etching the substrate using the residual photoresist as a third mask.

14. The method of claim 13, wherein the carbon nanotube composite structure comprises a carbon nanotube structure comprising the plurality of carbon nanotubes and a protective layer coated on each of the plurality of carbon nanotubes.

15. The method of claim 14, wherein the carbon nanotube structure comprises a first carbon nanotube film and a second carbon nanotube film stacked with each other.

16. The method of claim 15, wherein the first carbon nanotube film comprises a plurality of first carbon nanotubes that are joined end-to-end by van der Waals attractive force therebetween and substantially arranged along the same first direction; the second carbon nanotube film comprises a plurality of second carbon nanotubes that are joined end-to-end by van der Waals attractive force therebetween and substantially arranged along the same second direction; and the second direction is different from the first direction.

17. The method of claim 14, wherein each of the plurality of carbon nanotubes is fully enclosed by the protective layer.

18. The method of claim 14, wherein the protective layer comprises a material selected from the group consisting of metal, metal oxide, metal nitride, metal carbide, metal sulfide, silicon oxide, silicon nitride, and silicon carbide.

19. The method of claim 13, wherein the removing the photoresist layer comprises exposure and development.

20. The method of claim 13, wherein the removing the photoresist layer comprises soaking the photoresist layer in acetone for a time less than 10 hours.

* * * * *